United States Patent [19]

Nakabayashi

[11] Patent Number: 5,349,298
[45] Date of Patent: Sep. 20, 1994

[54] RF COIL SYSTEM FOR MRI
[75] Inventor: Kazuto Nakabayashi, Tochigi, Japan
[73] Assignee: Kabushiki Kaisha Toshiba, Kawasaki, Japan
[21] Appl. No.: 16,684
[22] Filed: Feb. 11, 1993
[30] Foreign Application Priority Data
  Feb. 14, 1992 [JP] Japan .................. 4-028320
[51] Int. Cl.$^5$ ........................... G01R 33/20
[52] U.S. Cl. ................................. 324/322
[58] Field of Search ............... 324/300, 307, 309, 318, 324/322; 333/174, 1.1, 109, 176, 205, 223

[56] References Cited
U.S. PATENT DOCUMENTS
4,460,879 7/1984 Hirose ................................ 333/174

OTHER PUBLICATIONS
"Nuclear Magnetic Resonance Imaging in Medicine and Biology" by Peter G. Morris, Clarendon Press, Oxford, pp. 225–243.
"A Disposable Prostrate Probe and Interface System for High Field", George J. Misic et al., SRAM 8th Annual Meeting 1989, p. 179.

Primary Examiner—Michael J. Tokar
Attorney, Agent, or Firm—Limbach & Limbach

[57] ABSTRACT

An RF coil system for MRI comprises a coil unit for producing an exciting RF magnetic field or receiving an MR signal. A distributed constant line is connected to the coil unit and is formed into a length less than $n\cdot(\lambda/4)$ (n is a positive integer of one or more), where $\lambda$ is an wavelength of the RF signal or MR signal. A lumped constant circuit is connected in series to the distributed constant line and virtually forming the length of $n\cdot(\lambda/4)$ in cooperation operatively with the distributed constant line.

20 Claims, 3 Drawing Sheets

RF COIL SYSTEM FOR MRI

BACKGROUND OF THE INVENTION

The present invention relates to a radio frequency (RF) coil system for magnetic resonance imaging (MRI), and more particularly to the RF coil system having a transmission line, combined by a distributed constant line and a lumped constant circuit, which connects an RF coil to an interface unit.

In MRI, one of the prior arts offers an imaging apparatus which has an RF coil system including a receiving probe for intra-cavities. The receiving probe is inserted into patient body cavities such as a rectum and receives a magnetic resonance (MR) signal for acquiring reconstructed images of the cavity wall and its wall-inner portion. The MR signal is provided by excitation of nuclei with an RF signal transmitted from, for example, by a whole-body coil as a separate transmitting RF coil set around the patient.

The receiving probe is exemplified by 'A Disposable Prostate Probe and Interface System For High Field', George J. Misic et al. SMRM 8th Annual Meeting 1989. Page 179', for instance. In this probe and interface system, a receiving coil is connected through a coaxial cable to a PIN diode in an interface box. The whole length of the coaxial cable determined to be a length of $\lambda/4$ when $\lambda$ is an wavelength of an MR signal. Thus, by utilizing the impedance conversion effect of the one quarter wavelength, the receiving coil is decoupled from an excitation magnetic field during the transmission phase.

There is provided another RF coil system using crossed diodes. The RF coil system is only for receiving an MR signal and comprises a single loop coil, a coaxial cable serving as a distributed constant line connected to the loop coil, and an interface unit connected between the coaxial cable and an image processor. The whole length of the coaxial cable is determined to be a length of $\lambda/4$ ($\lambda$ is an wavelength of an MR signal). A resonance capacitor is interleaved in the loop coil for forming a resonance circuit by the loop coil itself and capacitor.

The loop coil and coaxial cable form a part of probe, the part being inserted into body cavities. The interface unit incorporates crossed-diodes, a tuning capacitor, and a pre-amplifier, which are placed from the coaxial cable side, in turn.

Owing to a standing wave arising along the coaxial cable, the above-said effect of the one quarter wavelength (that is, the impedance conversion effect between one end and the other end of the cable) can also be utilized in order to decouple the loop coil from an RF magnetic field for excitation produced by a separate transmitting RF coil. As a result, no current is induced through the loop coil, and there will be almost no disturbance in the excitation RF field.

However, it is pointed out that the coaxial cable becomes rather long; for example, supposing that an wavelength contraction rate is approximately 0.68 for coaxial cables normally used and a static magnetic field of 0.5 tesla is accomplished (in this case, a resonant frequency of objective protons is 21.3 [MHz]), $\lambda/4=2.4$ [m]. The lower the strength of the magnetic, the lower the Larmor frequency. This means that the coaxial cable becomes further longer for maintaining the length of $\lambda/4$.

Such RF coil systems having the long coaxial cable cause different drawbacks as follows. First, for preparation and insertion into body cavities, the receiving probe (the part of the coil itself and the coaxial cable) gives an operator troublesome handling. This results in reduced maneuverability, thus reducing the throughput of diagnosis because of long operation time. At the same time, such receiving probes are undesirable for storage.

Second, longer coaxial cables cause greater signal loss and there will be a possibility of reducing a ratio of signal to noise. Third, it is required that the receiving probe, inserted into body cavities, should be disposable in view of sanitary affairs. Hence the use of longer coaxial cables give rise to higher manufacturing cost of the probe, and inspection cost per one time of diagnosis becomes also higher.

SUMMARY OF THE INVENTION

Accordingly, it is a primary object of the present invention to provide an RF coil system for MRI in which a distributed constant cable can be shortened down to a required length.

It is another primary object of the present invention to provide a receiving RF coil system for MRI which can remotely and passively switch between a transmitting and a receiving modes by the effect of a one quarter wavelength and in addition the length of a distributed constant line used therein can be shortened even if a Larmor frequency is low.

Still another object of the present invention is to improve maneuverability of a receiving probe.

Still another object of the present invention is to increase a ratio of signal to noise.

Still another object of the present invention is to provide a receiving RF coil system having a disposable, but low manufacturing-cost receiving probe.

These and other objects can be achieved according to the present invention, in one aspect by providing an RF coil system for magnetic resonance imaging, the system comprising: a coil unit for performing conversion between electrical current and magnetic field in regard to signals required in the magnetic resonance imaging; a distributed constant line connected to the coil unit and formed into a length less than $n \cdot (\lambda/4)$ (n is a positive integer of one or more), where $\lambda$ is a wavelength of the signals; and a lumped constant circuit being connected in series to the distributed constant line and virtually forming the length of $n \cdot (\lambda/4)$ (n is a positive integer of one or more) in cooperation operatively with the distributed constant line.

The RF coil system further comprises a switching circuit terminating the lumped constant circuit at its opposite end to the distributed constant line and exhibiting either one of an electrical open state and an electrical short state in response to a magnetic field for excitation.

In another aspect of the present invention, the RF coil system further comprises a detachable connector detachably connecting the distributed constant line and the lumped constant circuit

BRIEF DESCRIPTION OF THE DRAWINGS

The accompanying drawings which are incorporated in and constitute a part of this specification, illustrate embodiments of the present invention and, together with the description, serve to explain the principles of the present invention. In the drawings.

DESCRIPTION OF THE PREFERRED EMBODIMENTS

Embodiments of the present invention will now be described with reference to the accompanying drawings.

A first embodiment will now be described according to FIGS. 1 to 3.

Figure 1:
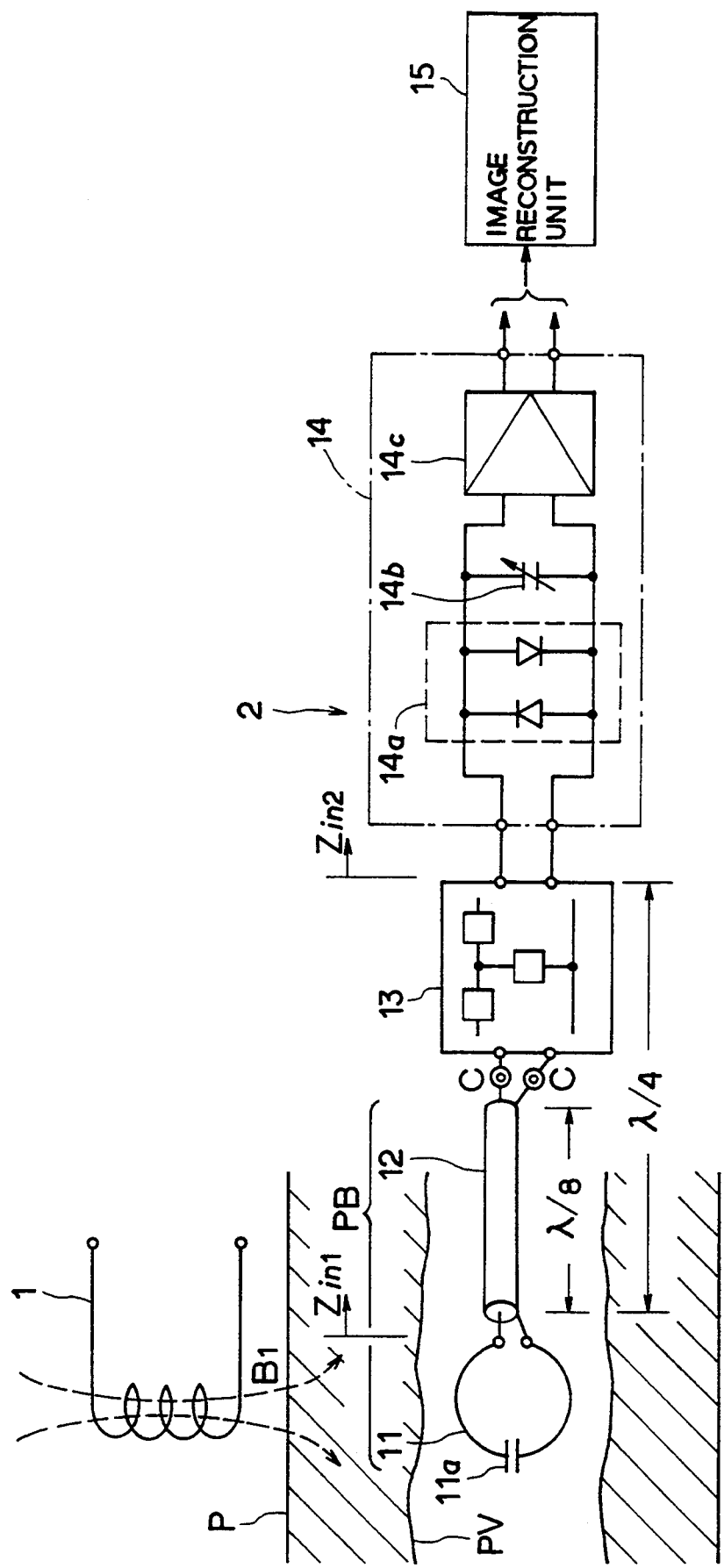
FIG. 1 shows in block form a receiving RF coil system for MRI of a first embodiment according to the present invention.

In FIG. 1, there are provided a transmitting RF coil 1 for transmitting an RF signal against a diagnostic part of a patient P as an object being diagnosed. The transmitting RF coil 1 is connected to a transmitting unit (not shown) composing an MRI apparatus.

There is also provided a receiving RF coil system 2 for MRI in FIG. 1. The receiving RF coil system 2 comprises a single loop coil 11. The loop coil 11, interleaved by a resonant capacitor 11a, is connected to a single coaxial cable 12 serving as a distributed constant line. The coaxial cable 12 and the loop coil 11 form a probe PB of the system 2 to be inserted into a body cavity CV of the patient P.

The coaxial cable 12 is further connected to a lumped constant circuit 13. The lumped constant circuit 13 is further coupled to an interface unit 14, the interface unit 14 being connected to an image reconstruction unit 15 composing the MRI apparatus.

As shown in FIG. 1, the interface unit 14 includes crossed-diodes 14a, a tuning capacitor 14b, and a preamplifier 14c, which are placed from the coaxial-cable side, in turn. The crossed-diodes 14a comprise a pair of diodes connected back to back with each other.

The coaxial cable 12 is coupled through detachable connectors C and C to the lumped constant circuit 13. The detachable connectors C and C allow the part of the loop coil 11 and coaxial cable 12 (that is, the probe PB) to be detached readily, thus the probe PB being disposable.

The coaxial cable 12 cooperates with the lumped constant circuit 13 to form a one quarter wavelength transmission line of an MR signal. In case the wavelength of the MR signal is expressed as $\lambda$, the coaxial cable 12 therein is designed to have a length of $\lambda/8$; in other words the coaxial cable 12 is half length compared to a conventional one having $\lambda/4$ contributable to the aforementioned impedance conversion effect.

The lumped constant circuit 13 here adopts a four-terminal network and compensates the shortened coaxial cable 12 in order to cooperatively form an equivalent transmission line of $\lambda/4$. In detail, in order to achieve the above impedance conversion effect, the remaining length $\lambda/8$ deducted from the $\lambda/4$ by the $\lambda/8$ of the coaxial cable 12 is assigned to the lumped constant circuit 13.

Now, a practical design method for the lumped constant circuit 13 will be explained.

Figure 2:
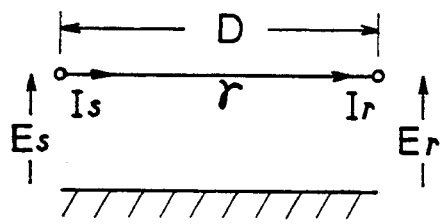
FIG. 2 shows an illustration for explaining a distributed constant transmission line model.

As shown in FIG. 2, a distributed constant circuit model having a length D is introduced. In the distributed constant circuit model, there is provided are a characteristic impedance Zo, a propagation constant $\gamma$, and a voltage Er and a current Ir at a receiving end. A voltage Es and a current Is at a feeding end can be expressed by the following equations.

$$E_s = E_r \cdot \cosh\gamma D + Z_0 \cdot I_r \cdot \sinh\gamma D$$

$$I_s = E_r \cdot \sinh\gamma D)/Z_o + I_r \cdot \cosh\gamma D$$

These equations can be deformed into a matrix form as follows, which can normally be used in four-terminal networks.

$$\begin{pmatrix} E_S \\ I_S \end{pmatrix} = \begin{pmatrix} \cosh\gamma D & Z_0 \cdot \sinh\gamma D \\ (\sin\gamma D)/Z_0 & \cosh\gamma D \end{pmatrix} \begin{pmatrix} E_r \\ I_r \end{pmatrix} \quad (1)$$

Figure 3:
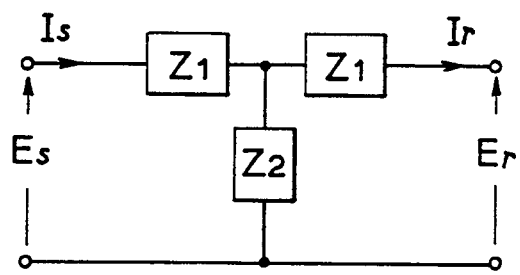
FIG. 3 represents an example of a T-type four-terminal network as a lumped constant circuit.

A transmission matrix [F] for a T-type four-terminal network, shown as FIG. 3, can be expressed as:

$$[F] = \begin{pmatrix} A & B \\ C & D \end{pmatrix} = \begin{pmatrix} 1 + Z_1/Z_2 & 2Z_1 + Z_1^2/Z_2 \\ 1/Z_2 & 1 + Z_1/Z_2 \end{pmatrix} \quad (2)$$

According to above matrixes (1) and (2), when impedance elements Z1 and Z2 composing the T-type four-terminal network are determined as $$Z_1 = Z_0 \cdot \tanh(\gamma D/2) \quad (3)$$

$$Z_2 = Z_0/\sinh\gamma D \quad (4)$$

thus the lumped constant circuit 13 can function as an equivalent distributed constant circuit of the length D.

For example, in the case of FIG. 1, the compensatory length is $\lambda/8$. Hence, when an attenuation constant is $\alpha$ and a phase constant is $\beta$, such-factors as $\gamma D = (\alpha + j\beta) D$, $\alpha = 0$ $\beta = 2\pi/\lambda$, $D = \lambda/8$, and $Z_0$ = a given characteristic impedance of the coaxial cable 12 are given to the above equations (3) and (4) to estimate the impedance elements Z1 and Z2 in FIG. 3. As apparent from above, this procedure can provide a simple technique for designing the lumped constant circuit 13 virtually corresponding to a distributed constant line of $\lambda/8$ should be compensated.

The receiving RF coil system 2 thus-constructed has the coaxial cable 12 (that is, the probe PB) having a shorter, but minimum necessary length to the insertion of the probe PB. Also the impedance conversion effect may be given. Such elimination of an excessive length of the probe 12 offers a wide variety of advantages.

The probe PB can be easily kept when diagnosis is not carried out. In diagnosis, the probe PB is inserted into the rectum of a patient, for instance, by hand until its loop coil 11 reaches a desired diagnostic portion therein. For this manual insertion, cumbersome handling due to the probe PB will be greatly diminished. The insertion, therefore, can be completed in a shorter time, leading to improved maneuverability and increased throughput. Resultant working load to an operator is also largely reduced. In addition, a minimum length of the probe PB required for its insertion can be maintained by the adoption of the distributed constant line 12.

For diagnosis, the receiving RF coil system 2 of the present embodiment shows the same impedance conversion effect as one explained before, although the coaxial cable 12 is shorter than $\lambda/4$. When viewing from the loop coil side, it is assumed that an input impedance of the coaxial cable 12 is Zin1 and an input impedance of the interface unit 14 is Zin2.

In transmitting phase, after the probe PB is inserted into a body cavity CV as shown in FIG. 1, an excitation RF field B1 starts being raised by the separate transmitting RF coil 1. Since the power of excitation RF field B1 is designed to be large, the crossed-diodes 14a in the interface unit 14 are kicked on almost simultaneously with the rise of the excitation RF field B1. The kick on causes the crossed-diodes 14a to be electrically short. Therefor, the input impedance Zin2 becomes almost zero and the input impedance Zin1 almost infinity by means of the combination of the coaxial cable 12 and the lumped constant circuit 13 forming the transmission line of an equivalent one quarter wavelength $\lambda/4$.

As a result, the loop coil 11 is desirably decoupled from the excitation RF magnetic field B1, no induced current owing to back electromotive force being occured therethrough. Hence, there will be no disturbance of the excitation RF field B1 caused by the loop coil 11.

In contrast, in receiving phase, an MR signal received is so much weaker in power than the excitation RF signal that the MR signal can not kick on the crossed-diodes 14a. The off state of the crossed-diodes 14a allows the input impedance Zin2 to change into a higher value and the input impedance Zin1 into a lower value than that in the RF excitation duration (i.e., the transmitting phase), this time.

With the help of the resonant capacitor 11a, the loop coil 11 is brought to a resonant state with the MR signal, flowing a resonant current through the loop coil 11. The power of the MR signal may be transmitted through the coaxial cable 12 and the lumped constant circuit 13 to the pre-amplifier 14c. Therefore, image reconstruction is carried out in the image reconstruction unit 15.

As apparent, the impedance conversion effect by the combination of the coaxial cable 12 and the lumped constant circuit 13 can provide the automatic, remote and passive changes of the operating modes (e.g., the transmitting phase and receiving phase) of the receiving RF coil system 2.

Furthermore, the distributed constant cable 12 so shortened offers a reduction in signal transmission. Thus, the received MR signal can be transmitted to the input unit 15 with an improved signal to noise ratio.

On the other hand, the probe PB can be used in disposable way. As manufacturing cost of the probe PB is reduced owing to the shortened cable 12, the probe PB suits to the disposable use in diagnosis cost.

In the present invention, the combination of the coaxial cable 12 and the lumped constant circuit 13 is not limited to a one quarter wavelength ($\lambda/4$) in virtual length. If necessary, a three quarter wavelength ($3\lambda/4$) and a five quarter wavelength ($5\lambda/4$) and so on (that is, n ($\lambda/4$): n is a positive odd number of one or more) are possible in accordance with factors including the kind of body cavities; in that cace, the coaxial cable 12 itself should be less than ($3\lambda/4$) or ($5\lambda/4$).

Further, even if the virtual, whole length of the coaxial cable 12 and the lumped constant circuit 13 is fixed to be $\lambda/4$, the distributed cable 12 is not limited to $\lambda/8$ in length. Any shorter length than $\lambda/4$ is usable according to the kind of diagnosis. For example, the coaxial cable is $\lambda/16$ in length, the lumped constant circuit should be $\lambda/16$ in total $\lambda/4$.

Still further, the coaxial cable 12 mentiond above may be replaced by a two-wire feeder. The lumped constant circuit 13 mentioned above may be constructed by a $\pi$-type four-terminal network readily converted by calculation from the above-explained T-type four-terminal network.

As one of deformations of the first embodiment, another pair of detachable connectors is used between the lumped constant circuit 13 and the interface unit 14 for connecting both of them detachably. By this detachable mechanism, a wide variety of lumped constant circuits are used readily so that a virtual whole length of the cable and circuit can always be kept a constant, for instance, $\lambda/4$, even when the length of the coaxial cable is changed. This detachable mechanism also shows significance such that, when the MR resonant frequency is changed, it is convenient to select a coaxial cable having a necessary minimum length and a lumped constant circuit compensating the total virtual length. This advantage is, in particular, effective in lower static magnetic field, where the wavelength is larger.

Figure 4:
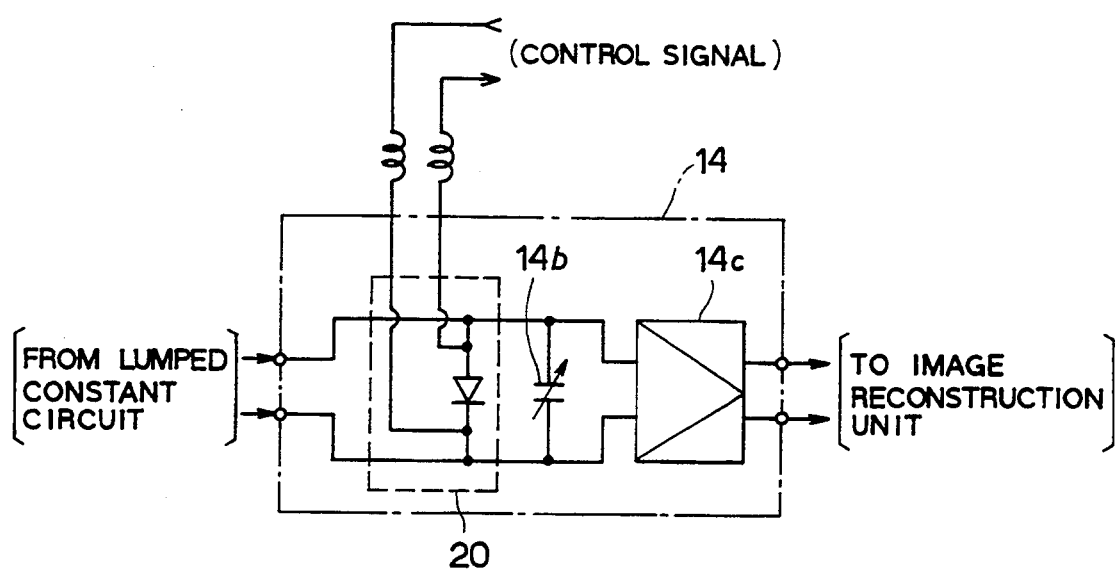
FIG. 4 shows a second embodiment of the present invention representing another interface unit.

A second embodiment of the present invention is now explained according to FIG. 4.

As shown in the figure, the interface unit 14 comprises a PIN diode 20 instead of the aforementioned crossed-diodes. The PIN diode 20 is kicked on by a control signal from a sequence controller (not shown) during the transmitting phase. This switching mechanism offers active remote control of the operating modes of the receiving RF coil system.

Figure 5:
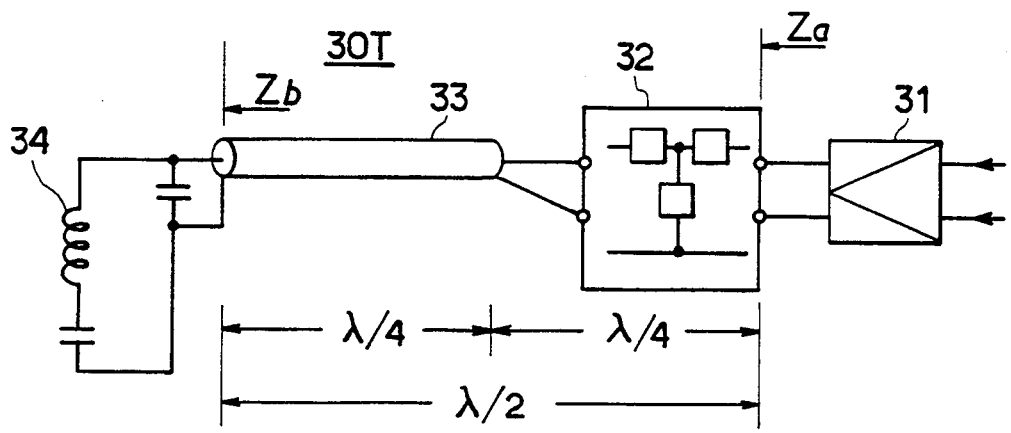
FIG. 5 shows a transmitting RF coil system of a third embodiment of the present invention.
Figure 6:
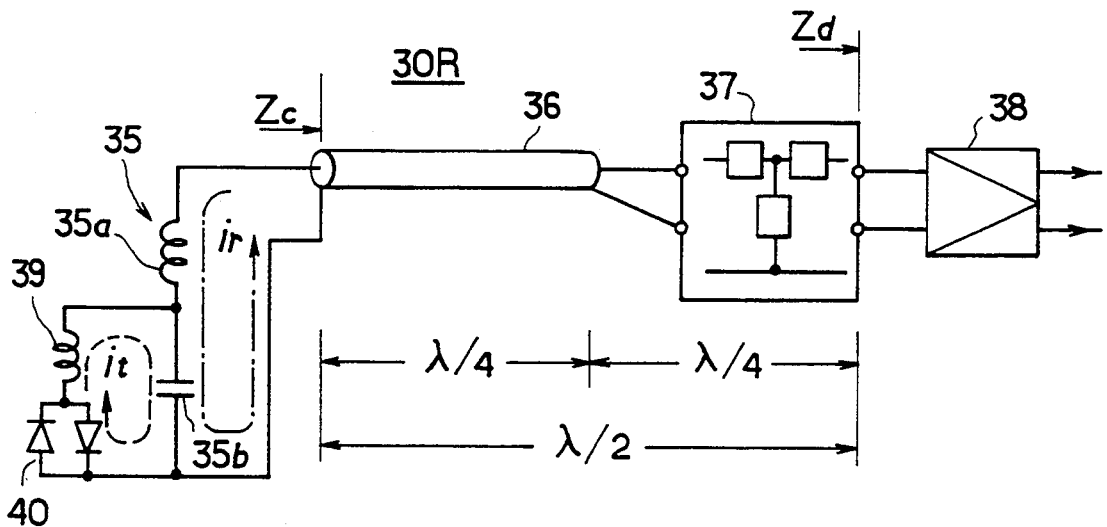
FIG. 6 represents a receiving RF coil system of the third embodiment.
Figure 7:
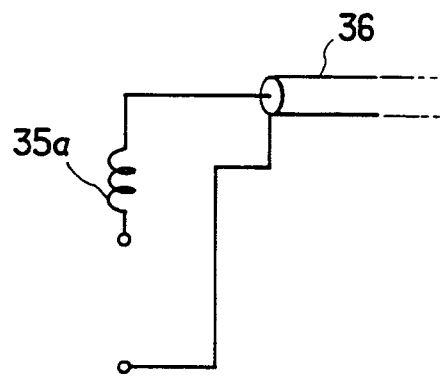
FIG. 7 is an electrically equivalent illustration of a receiving coil during a transmitting phase in the third embodiment.

A third embodiment of the present invention is now explained according to FIGS. 5 to 7.

FIG. 5 shows a transmitting RF coil system 30T and FIG. 6 shows a receiving RF coil system 30R, respectively. Both of the transmitting and receiving RF coil system 30T and 30R constitute a pair of RF coil system.

The transmitting RF coil system 30T comprises an RF amplifier 31, a lumped constant circuit 32, a coaxial cable 33, and a transmitting RF coil 34. The length of the coaxial cable 33 is $\lambda/4$ ($\lambda$ is an wavelength of an RF signal). The lumped constant circuit 32 is formed by the same manner described in the first embodiment, but compensating virtual length to the cable 33 is $\lambda/4$. Thus, the total length of the cable 33 and circuit 32 is $\lambda/2$ virtually. This length $\lambda/2$ allows impedances Za and Zb at both ends of the combined line (see FIG. 5) to be equal, thus the RF signal being carried desirably through the circuit 32 and cable 33 to the RF coil 34.

In contrast, the receiving RF coil system 30R comprises a receiving RF coil unit 35, a coaxial cable 36, a lumped constant circuit 37, and a pre-amplifier 38. The coil unit 35 includes a coil 35a and a resonant capacitor 35b connected in series. A serial circuit comprising a coil 39 and crossed-diodes 40 is connected to the resonant capacitor 35b in parallel. The coaxial cable 36 and lumped constant circuit 37 is designed in the same manner and length, so that impedances Zc and Zd at both ends of the combined line (see FIG. 6) also show an equal value to each other owing to the length λ/2 of the cable 36 and the circuit 37.

During the transmitting phase, a resonant current $i_t$ flows through the coil 39, the capacitor 35b, and the crossed-diodes 40, as shown by a dotted line in FIG. 6. In this state, the flowing of the resonant current $i_t$ is equivalent to a circuit shown in FIG. 7, opening the electrical loop of the receiving RF coil 35a. Thus the receiving RF coil 35a is desirably decoupled from an exciting RF field produced by the transmitting RF coil 34 of FIG. 5.

On the one hand, during the receiving phase, the receiving RF coil 35a and the resonant capacitor 35b resonate to flow a resonant current $i_r$ (see a dashed line in FIG. 6) corresponding to an MR signal. The power of the resonant current $i_r$ is desirably transmitted through in FIG. 6) corresponding to an MR signal. The power of the cable 36 and the circuit 37 to the pre-amplifier 38.

Apparent from the above, the combination of a coaxial cable and a lumped constant circuit can be used for signal transmission utilizing the same impedances at the both ends of the line of λ/2.

In the third embodiment, n(λ/4) (n is a positive even number of two or more) is possible. The above receiving RF coil system is also possible to be used as an intra-cavity probe.

What we claim is:

1. An RF coil system for magnetic resonance imaging of an object, the system comprising:
    a coil unit for transmitting a radio frequency signal to the object and receiving a magnetic resonance signal from the object;
    a distributed constant electrical line electrically connected to the coil unit and formed into a length less than n · (λ/4) (n is a positive integer of one or more), where λ is a wavelength of at least one of the radio frequency signal and the magnetic resonance signal; and
    a lumped constant electrical circuit being electrically connected in series to the distributed constant electrical line and virtually forming the length of a n · (λ/4) (n is a positive integer of one or more) in cooperation operatively with the distributed constant electrical line.

2. The RF coil system for magnetic resonance imaging according to claim 1, wherein said integer n is an odd number.

3. The RF coil system for magnetic resonance imaging according to claim 2, wherein said coil unit only receives a magnetic resonance signal from the object being imaged.

4. The RF coil system for magnetic resonance imaging according to claim 3, further comprising a switching circuit terminating said lumped constant electrical circuit at an end opposite to the end connecting said lumped electrical circuit to said distributed constant electrical line and exhibiting either one of an electrical short state and an electrical open state in response to existence and non-existence, respectively of a magnetic field for excitation produced by the radio frequency signal.

5. The RF coil system for magnetic resonance imaging according to claim 4, wherein said distributed constant electrical line is a coaxial cable.

6. The RF coil system for magnetic resonance imaging according to claim 4, wherein said distributed constant electrical line is a two wire feeder.

7. The RF coil system for magnetic resonance imaging according to claim 4, wherein said lumped constant electrical circuit has either one of a T-type four terminal electrical network or a π-type four terminal electrical network each consisting of a plurality of lumped electrical elements.

8. The RF coil system for magnetic resonance imaging according to claim 4, wherein said coil unit has a loop coil for insertion into a cavity of the object.

9. The RF coil system for magnetic resonance imaging according to claim 4, wherein said switching circuit has a pair of diodes cross connected to one another.

10. The RF coil system for magnetic resonance imaging according to claim 4, wherein said switching circuit has a PIN diode.

11. The RF coil system for magnetic resonance imaging according to claim 4, further comprising a detachable connector positioned between said distributed constant electrical line and said lumped constant electrical circuit and detachably connecting said distributed constant electrical line and said lumped constant electrical circuit.

12. Th RF coil system for magnetic resonance imaging according to claim 1, wherein said integer n is an even number.

13. The RF coil system for magnetic resonance imaging according to claim 12, wherein said coil unit only transmits a radio frequency magnetic field to the object being imaged.

14. The RF coil system for magnetic resonance imaging according to claim 12, wherein said coil unit only receives a magnetic resonance signal from the object being imaged.

15. The RF coil system for magnetic resonance imaging according to claim 14, wherein said coil unit further comprising a coil circuit for receiving said magnetic resonance signal and a decoupling circuit for electrically opening the coil circuit in response to the magnetic field for excitation produced by the radio frequency signal.

16. The RF coil system for magnetic resonance imaging recording to claim 13, wherein said distributed constant electrical line is a coaxial cable.

17. The RF coil system for magnetic resonance imaging according to claim 13 lumped constant electrical circuit has either one of a T-type four-terminal electrical network or π-type four-terminal electrical network each consisting of a plurality of lumped electrical elements.

18. The RF coil system for magnetic resonance imaging according to claim 14, wherein said distributed constant electrical line is a coaxial cable.

19. The RF coil system for magnetic resonance imaging according to claim 14, wherein said lumped constant electrical circuit has either one of a T-type four-terminal electrical network or a π-type four-terminal electrical network each consisting of a plurality of lumped electrical elements.

20. The RF coil system for magnetic resonance imaging according to claim 15, wherein said decoupling circuit has a pair of diodes cross connected to one another.

* * * * *